United States Patent [19]

Nishizawa et al.

[11] 3,793,093

[45] Feb. 19, 1974

[54] METHOD FOR PRODUCING A SEMICONDUCTOR DEVICE HAVING A VERY SMALL DEVIATION IN LATTICE CONSTANT

[75] Inventors: Junichi Nishizawa, Sendai; Ichiemon Sasaki, Yokohama, both of Japan

[73] Assignee: Handotai Kenkyu Shinkokai Kawauchi, Gendai-shi, Miyagi-ken, Japan

[22] Filed: Jan. 12, 1973

[21] Appl. No.: 323,265

[52] U.S. Cl. ................ 148/186, 148/187, 148/189, 148/171, 148/172, 252/62.3 GA, 148/1.5

[51] Int. Cl. ............................ H01l 7/38, H01l 7/44

[58] Field of Search .... 148/186, 1.5, 190, 187, 175, 148/171; 252/62.3 E, 62.3 GA

[56] References Cited

UNITED STATES PATENTS

| | | | |
|---|---|---|---|
| 3,249,831 | 5/1966 | New et al. | 148/186 X |
| 3,445,302 | 5/1969 | Lepiane | 148/190 X |
| 3,496,118 | 2/1970 | Willardson et al. | 252/62.3 GA |
| 3,632,431 | 1/1972 | Andre et al. | 148/171 X |
| 3,663,320 | 5/1972 | Maruyama et al. | 148/190 X |

*Primary Examiner*—G. T. Ozaki

[57] ABSTRACT

A method for producing a semiconductor device using a semiconductor, in which at least two kinds of impurities having different atomic radiuses from one another and from that of the semiconductor are doped in the semiconductor for providing one conduction band therein, so that the lattice constant of the semiconductor is substantially constant.

6 Claims, No Drawings

METHOD FOR PRODUCING A SEMICONDUCTOR DEVICE HAVING A VERY SMALL DEVIATION IN LATTICE CONSTANT

This invention relates to a method for producing a semiconductor device.

In conventional methods for producing semiconductor devices, only one impurity is doped to provide one conduction band. However, since the semiconductor and the impurity are different in atomic radius from each other, a deviation is effected in the lattice constant of the semiconductor so as to cause constructive distortion therein and to develop lattice defects, thus resulting in deteriorated characteristic of the semiconductor device.

An object of this invention is to provide a method capable of producing a semiconductor device having no deviation in lattice constant.

In accordance with the principle of this invention at least two impurities having different atomic radiuses are disposed to provide one conduction band, so that a deviation in the lattice constant of a produced semiconductor can be substantially eliminated.

EXAMPLE 1

In the case of germanium, its atomic radius is a value of 1,394A. For example, if antimony is used for providing an N-type region the lattice constant of germanium increases, that is, its lattices become expanded to cause lattice defects because antimony has an atomic radius of 1.614A. However, this can be avoided by further doping of an N-type impurity for example phosphorus. Since atomic radius of phosphorus is 1.08A and smaller than that of germanium, while doping of phosphorus only causes the lattices of germanium to become contracted which similarly result in the lattice defect, but doping of suitable amounts of antimony and phosphorus combines the above two effects with each other to prevent any deviation in the lattice constant and hence any lattice defect.

EXAMPLE 2

Arsenic may be doped in germanium as an N-type impurity at a concentration of $3 \times 10^{18}/cm^3$, while antimony is further doped as an N-type impurity at a concentration of $1 \times 10^{18}/cm^3$ to prevent decrease of the lattice constant.

EXAMPLE 3

The same result can be obtained in a compound semiconductor. In the case of gallium arsenide by way of example, the atomic radius of gallium is 1.35A and that of Arsenic is 1.25A. For example, if tellurium having an atomic radius of 1.45A is doped for producing an N-type region, lattices become expanded to cause lattice defects. However, if selenium which is an N-type impurity is doped simultaneously with the doping of tellurium, selenium serves to contract lattices because the atomic radius of selenium is 1.14A. Namely, its effect is combined with that of tellurium to prevent any deviation in the lattice constant and hence any lattice defect. For example, selenium is doped at a concentration of $2 \times 10^{18}/cm^3$ while tellurium is doped at a concentration of $3 \times 10^{17}/cm^3$.

In Example 3 the atomic radius of the impurity is larger or smaller than those of both atoms of the compound semiconductor. However, it is possible to use impurities whose atomic radiuses are between those of the atoms of the compound semiconductor.

Furthermore, while the foregoing examples are described in connection with the case where an impurity of the same conductivity type as the conduction band to be obtained is doped, it is also possible to use an appropriate amount of an impurity of different conductivity type. For example, indium which is a P-type impurity may be doped to compensate a decrease of the lattice constant caused by a combination of arsenic which is an N-type impurity with germanium.

The method of this invention can be actually performed in accordance with liquid growth techniques by way of example. In this case where an N-type GaAs layer is grown on a substrate of undoped GaAs, 2 mill-grams of tellurium and 1 to 2 milligrams selenium are mixed with a melt of 1 gram of Ga in addition to polycrystal of GaAs of appropriate amount (e.g. 0.2 grams) so that the melt of Ga is contacted with the substrate of GaAs at a temperature of 1,050°C and then cooled to a temperature of 1,000°C during a time of 2 minutes. As a result of the above processes a grown layer of about 20 microns having a compensated lattice constant can be obtained. In a case where a $n^+n$ layer is grown, a Se-doped $n^+$ substrate of $2 \times 10^{18}/cm^3$ is employed by way of example and processed by steps similar to the above-mentioned steps. However, $5 \times 10^{-3}$ atomic percent of tellurium is added in the melt in place of selenium.

What we claim is:

1. In a method for producing a semiconductor device using a semiconductor, the improvement comprising a step of doping at least two kinds of impurities having different atomic radiuses from one another and from that of the semiconductor in the semiconductor device for providing one conduction band therein so that the lattice constant of the semiconductor is substantially constant.

2. A method for producing a semiconductor device according to claim 1 in which antimony and phosphorus are doped as the impurities in a germanium semiconductor.

3. A method for producing a semiconductor device according to claim 1 in which the impurities have the same conductivity type as the conduction band.

4. A method for producing a semiconductor device according to claim 3, in which antimony and phosphorus are dopes as the impurities in a germanium semiconductor.

5. A method for producing a semiconductor device according to claim 1, in which the impurities have the conductivity type different from the conduction band.

6. A method for producing a semiconductor device according to claim 1, in which tellurium and selenium are doped as the impurities in a compound semiconductor of gallium arsenide.

* * * * *